(12) United States Patent
Kuball et al.

(10) Patent No.: US 11,791,157 B2
(45) Date of Patent: Oct. 17, 2023

(54) SEMICONDUCTOR ON DIAMOND SUBSTRATE, PRECURSOR FOR USE IN PREPARING A SEMICONDUCTOR ON DIAMOND SUBSTRATE, AND METHODS FOR MAKING THE SAME

(71) Applicant: THE UNIVERSITY OF BRISTOL, Bristol (GB)

(72) Inventors: Martin Hermann Hans Kuball, Bristol (GB); James Wayne Pomeroy, Bristol (GB); Michael John Uren, Worcestershire (GB); Oliver Aneurin Williams, South Wales (GB)

(73) Assignee: THE UNIVERSITY OF BRISTOL, Leicester (GB)

( * ) Notice: Subject to any disclaimer, the term of this patent is extended or adjusted under 35 U.S.C. 154(b) by 236 days.

(21) Appl. No.: 17/185,191

(22) Filed: Feb. 25, 2021

(65) Prior Publication Data

US 2021/0183648 A1 Jun. 17, 2021

Related U.S. Application Data

(63) Continuation-in-part of application No. PCT/GB2019/052365, filed on Aug. 23, 2019.

(51) Int. Cl.
*H01L 21/02* (2006.01)
*H01L 21/683* (2006.01)
*H01L 21/78* (2006.01)

(52) U.S. Cl.
CPC .. *H01L 21/02502* (2013.01); *H01L 21/02664* (2013.01); *H01L 21/6835* (2013.01); *H01L 21/7806* (2013.01)

(58) Field of Classification Search
None
See application file for complete search history.

(56) References Cited

U.S. PATENT DOCUMENTS

| 7,595,507 B2 | 9/2009 | Francis et al. |
| 8,674,405 B1 | 3/2014 | Babic et al. |
| 2017/0025564 A1 | 1/2017 | Dadgar et al. |

FOREIGN PATENT DOCUMENTS

| CN | 104409593 A | 3/2015 |
| FR | 2978601 A1 | 2/2013 |
| WO | WO-2016/180849 A1 | 11/2016 |

OTHER PUBLICATIONS

Ma et al, CN 104409593 A, A Method for Fabricating a Nitride Epitaxial Layer, The Substrate with the Device Wafer, Mar. 11, 2015. (Year: 2015).*

(Continued)

*Primary Examiner* — Alexander G Ghyka
(74) *Attorney, Agent, or Firm* — MARSHALL, GERSTEIN & BORUN LLP

(57) ABSTRACT

The invention provides a method 100 of manufacturing a precursor 105*a* for use in manufacturing a semiconductor-on-diamond substrate 110, the method comprising:
  a) starting with a base substrate 112;
  b) forming a sacrificial carrier layer 114 on the base substrate, the sacrificial carrier layer comprising a single-crystal semiconductor;
  c) forming a single-crystal nucleation layer 116 on the sacrificial carrier layer, the single-crystal nucleation layer arranged to nucleate diamond growth; and
  d) forming a device layer 118 on the single-crystal nucleation layer, the device layer comprising a single-crystal semiconductor layer or multiple single-crystal semiconductor layers.

9 Claims, 4 Drawing Sheets

(56) References Cited

OTHER PUBLICATIONS

Feng, CN 105070652A, GaN Layer Growth Method and LED Epitaxial Layer and an LED Chip, Nov. 18, 2015. (Year: 2015).*
Search Report issued in Great Britain Patent Application No. 1814192.9 dated Feb. 20, 2019.
Ejeckam, F. et al., "S2-T1: GaN-on-Diamond: A Brief History," 2014 Lester Eastman Conference on High Performance Devices (LEC), IEEE (Aug. 5, 2014).
Jungwan, Cho et al., "Thermal Interface Resistance Measurements for GaN-on-Diamond Composite Substrates," 2014 IEEE Compound Semiconductor Integrated Circuit Symposium (CSICS) (Oct. 19, 2014).
Gerrer, Thomas et al., "Transfer of AlGaN/GaN RF-Devices onto diamond substrates via van der Walls bonding," International Journal of Microwave and Wireless Technologies, vol. 10, No. 5-6 (Jun. 2018).
International Search Report and Written Opinion issued in PCT Patent Application No. PCT/GB2019/052365 dated Oct. 15, 2019.

* cited by examiner

SEMICONDUCTOR ON DIAMOND SUBSTRATE, PRECURSOR FOR USE IN PREPARING A SEMICONDUCTOR ON DIAMOND SUBSTRATE, AND METHODS FOR MAKING THE SAME

TECHNICAL FIELD

This invention relates to a semiconductor on diamond substrate, a precursor for use in preparing a semiconductor on diamond substrate, and methods for making the same.

BACKGROUND

Semiconductor wafers are used to make components for electronic, including power, RF and microwave devices, and also for optical devices, including light emitting diodes and laser diodes. Such devices are limited in their efficiency and capacity by how much waste heat can be extracted from them. Diamond is a good candidate for heat extraction, in particular for using as a heat transfer layer within such wafers.

FIG. 1 schematically shows a known method for producing a semiconductor on diamond substrate 10. The substrate production method begins with the provision of a grown structure comprising a Si (or other) substrate 12 upon which there is provided one or more transition layers 14, upon which there is a provided a semiconductor device layer 16, such as a GaN device layer, which can contain different epilayers such as GaN, AlGaN, InGaN or others. The device layer is arranged to have electrical circuits formed thereon, for example by deposition, removal, patterning or modification of electrical properties. The transition layer 14 is arranged to provide some lattice matching or strain matching between the Si substrate 12 and the semiconductor device layer 16.

At step 40, a handle wafer 18 is attached onto the device layer 16. This typically involves an attachment layer such as spin on glass, or in other embodiments the attachment may be provided by a wafer bonded interface.

At step 42, the Si substrate 12 is removed.

At step 44, the or each transition layer 14 is removed.

At step 46, an amorphous nucleation layer 20 is deposited on the semiconductor device layer 16 on its exposed side. The exposed side is the side that is opposite to the side at which the handle wafer 18 is attached. The amorphous nucleation layer 20 is arranged to enable diamond nucleation and growth.

At step 48, a diamond layer 22 is grown onto the amorphous nucleation layer 20.

At step 50, the handle wafer 18 is removed. After removal of the handle wafer 18, the semiconductor on diamond substrate 10 is provided. The exposed surface of the semiconductor device layer 16 may be prepared for further processing, for example by cleaning, e.g. to remove protective layers. The semiconductor on diamond substrate structure 10 is then available for processing of high end RF and other devices.

SUMMARY OF DISCLOSURE

According to an aspect, the invention provides a method of manufacturing a precursor for use in manufacturing a semiconductor-on-diamond substrate, the method comprising:

a) starting with a base substrate;
b) forming a sacrificial carrier layer on the base substrate, the sacrificial carrier layer comprising a single-crystal semiconductor;
c) forming a single-crystal nucleation layer on the sacrificial carrier layer, the single-crystal nucleation layer arranged to nucleate diamond growth; and
d) forming a device layer on the single-crystal nucleation layer, the device layer comprising a single-crystal semiconductor layer or multiple single-crystal semiconductor layers.

Advantageously, the inventive method leads to an improved precursor which subsequently leads to a better or more efficiently produced final semiconductor on diamond substrate compared to prior art techniques. The precursor is better because of how it is formed according to the inventive method. In particular, as will become apparent, the surface boundaries between the layers of the precursor and at the exposed surfaces of the precursor are better than prior wafers for their subsequent intended use (formation of a suitable surface for nucleating diamond growth in combination with provision of a suitable device layer surface).

The method optionally comprises continuously growing the sacrificial carrier layer then the nucleation layer then the device layer to achieve steps b) to d). Optionally, the continuously growing comprises performing steps b) to d) in a growth chamber and not removing the precursor being manufactured from the growth chamber during performing steps b) to d).

Optionally, the step of forming the single-crystal nucleation layer comprises depositing the nucleation layer via 2D or 3D growth or layer by layer growth, preferably by 2D or layer by layer growth.

Optionally, the continuously growing comprises reasonably lattice matching the sacrificial carrier layer with the single-crystal nucleation layer and the single-crystal nucleation layer with the device layer.

The method optionally includes that:
step b) comprises forming the single-crystal sacrificial carrier layer having a dislocation density of less than a first threshold dislocation density, such as $10^9$ cm$^{-2}$;
step c) comprises forming the single-crystal nucleation layer having a dislocation density of less than a second threshold dislocation density, such as $0.5 \times 10^9$ cm$^{-2}$; and
step d) comprises forming the single-crystal device layer having a dislocation density of less than a third threshold dislocation density, such as $10^8$ cm$^{-2}$.

Optionally, after step a) and before step b), the method comprises forming one or more transition layers between the base substrate and the sacrificial carrier layer, the one or more transition layers being arranged to facilitate transition from the base substrate to the sacrificial carrier layer, and optionally wherein facilitating transition comprises relieving strain or nucleating growth of the sacrificial carrier layer or both.

The method optionally comprises bonding or forming a handle layer on the device layer.

The method optionally comprises removing the base substrate, further optionally chemically or by mechanical polishing or by a combination thereof.

Optionally, the method comprises selectively removing, such as by selectively etching, the one or more transition layers.

Optionally, the method comprises selectively removing, such as by selectively etching, the sacrificial carrier layer wherein the selective removal process stops at the nucleation layer or the transition layers.

Optionally, step b) comprises forming the sacrificial carrier layer from a first material such that the sacrificial carrier layer has a first removal rate, and wherein step c) comprises forming the nucleation layer from a second material such that the nucleation layer has a second removal rate, wherein the first removal rate is different from the second removal rate.

According to another aspect there is provided a method of manufacturing a semiconductor-on-diamond substrate, the method comprising the method of the above-mentioned aspect and further comprising growing a diamond layer, such as a synthetic diamond layer, onto the nucleation layer after the selective removal of the sacrificial carrier layer. Optionally, the method comprises pre-treating the nucleation layer with a plasma or similar prior to growing the diamond layer thereon—further optionally, in the case of an AlN nucleating layer, the method comprises pre-treating the nucleation layer by treating the AlN nucleating layer with $N_2$ and/or $H_2$ plasma for a certain period of time.

The method optionally comprises removing, optionally selectively removing, the handle layer.

Optionally step d) comprises forming the device layer from a third material such that the device layer has a third removal rate, bonding or forming the handle layer comprises bonding or forming the handle layer comprising a fourth material such that the handle layer has a fourth removal rate, wherein the fourth removal rate is different from the third removal rate.

The method optionally includes that any one or more of:
- the base substrate comprises a Si substrate, a SiC substrate, AlN composite or a sapphire substrate;
- the single-crystal sacrificial carrier layer comprises SiC, GaN, AlN, InN, AlGaN, InGaN, BN, BAlN, ScN, Si and alloys thereof, $Ga_2O_3$, $Al_2O_3$, MgO and alloys thereof; and optionally has a thickness of over 100 nm;
- the single-crystal nucleation layer comprises SiC, GaN, AlN, AlGaN, ScN, BN, HfN, ZrN, InN, Si, Ge, TiN or alloys thereof, as well as oxide based materials such as $Ga_2O_3$, $Al_2O_3$, MgO and alloys thereof, and optionally:
  has a thickness of 5 nm to 100 nm, such as 5 nm to 50 nm; and/or
  has a thermal conductivity of 5 to 600 W/m·K;
- the single-crystal device layer comprises SiC, GaN, AlN, InN, BN, Si and alloys thereof, $Ga_2O_3$, $Al_2O_3$, MgO and alloys thereof, or comprises a multilayer structure such as a 25 nm AlGaN on GaN layer, or 3 nm GaN-20 nm AlGaN—GaN layer or a GaN—InGaN—GaN layer combination, and optionally has a thickness of up to 5000 nm; and
- the one or more transition layers comprises one or more of SiC, AlN, GaN, AlGaN or AlGaN/AlGaN, BN, Si and alloys thereof, $Ga_2O_3$, $Al_2O_3$, MgO and alloys thereof such as:
  a 5 nm to 200 nm thickness AlN or AlGaN layer, with 3D morphology and grown on a SiC or sapphire substrate, for subsequent GaN sacrificial carrier layer growth;
  on a Si substrate, an AlN transition layer followed by a GaN/AlN superlattice transition layer for subsequent GaN sacrificial carrier layer growth;
  on a Si substrate, an AlN transition layer followed by an AlN/AlGaN/GaN graded alloy transition layer for subsequent GaN sacrificial carrier layer growth.

According to another aspect, the invention provides a layered precursor for subsequent use in preparing a semiconductor-on-diamond substrate, the precursor comprising in order a base substrate, a sacrificial single-crystal semiconductor carrier layer, a single-crystal nucleation layer arranged to nucleate diamond growth, a single-crystal semiconductor device layer or semiconductor device multilayer structure.

Optionally, the layered precursor further comprises one or more transition layers between the base substrate and the sacrificial carrier layer, the one or more transition layers being arranged to facilitate transition from the base substrate to the sacrificial carrier layer, and optionally wherein facilitating transition comprises relieving strain or nucleating growth of the sacrificial carrier layer or both.

The layered precursor optionally includes any one or more of:
- the base substrate comprises a Si substrate, a SiC substrate, AlN composite or a sapphire substrate;
- the single-crystal sacrificial carrier layer comprises SiC, GaN, AlN, InN, AlGaN, InGaN, BN, BAlN, ScN, Si and alloys thereof, $Ga_2O_3$, $Al_2O_3$, MgO and alloys thereof; and optionally has a thickness of over 100 nm;
- the single-crystal nucleation layer comprises SiC, GaN, AlN, AlGaN, ScN, BN, HfN, ZrN, InN, Si, Ge, TiN or alloys thereof, as well as oxide based materials such as $Ga_2O_3$, $Al_2O_3$, MgO and alloys thereof, and optionally:
  has a thickness of 5 nm to 100 nm, such as 5 nm to 50 nm; and/or
  has a thermal conductivity of 5 to 600 W/m·K;
- the single-crystal device layer comprises SiC, GaN, AlN, InN, BN, Si and alloys thereof, $Ga_2O_3$, $Al_2O_3$, MgO and alloys thereof, or the semiconductor device multilayer structure comprises a multilayer structure such as a 25 nm AlGaN on GaN layer, or 3 nm GaN-20 nm AlGaN—GaN layer or a GaN—InGaN—GaN layer combination, and optionally has a thickness of up to 5000 nm; and
- the one or more transition layers comprises one or more of SiC, AlN, GaN, AlGaN or AlGaN/AlGaN, BN, Si and alloys thereof, $Ga_2O_3$, $Al_2O_3$, MgO and alloys thereof such as:
  a 5 nm to 200 nm thickness AlN layer, with 3D morphology and grown on a SiC or sapphire substrate, for subsequent GaN sacrificial carrier layer growth;
  on a Si substrate, an AlN transition layer followed by a GaN/AlN superlattice transition layer for subsequent GaN sacrificial carrier layer growth;
  on a Si substrate, an AlN transition layer followed by an AlN/AlGaN/GaN graded alloy transition layer for subsequent GaN sacrificial carrier layer growth.

The layered precursor optionally includes that:
- the single-crystal sacrificial carrier layer has a dislocation density of less than a first threshold dislocation density, such as $10^9$ cm$^{-2}$;
- the single-crystal nucleation layer has a dislocation density of less than a second threshold dislocation density, such as $0.5\times10^9$ cm$^{-2}$; and
- the single-crystal device layer or semiconductor device multilayer structure has a dislocation density of less than a third threshold dislocation density, such as $10^8$ cm$^{-2}$.

According to another aspect, the invention provides a semiconductor-on-diamond substrate comprising a single-crystal device layer or semiconductor device multilayer structure, a single-crystal nucleation layer arranged to nucleate diamond growth and a diamond layer wherein the thermal resistance of the interface between the device layer or semiconductor device multilayer structure and the diamond layer is improved relative to prior systems. Improved results achievable using this invention are specified in table 1 in the description below.

BRIEF DESCRIPTION OF THE DRAWINGS

Embodiments of the invention will now be described, by way of example only, with reference to the accompanying drawings in which.

DESCRIPTION

Figure 1:
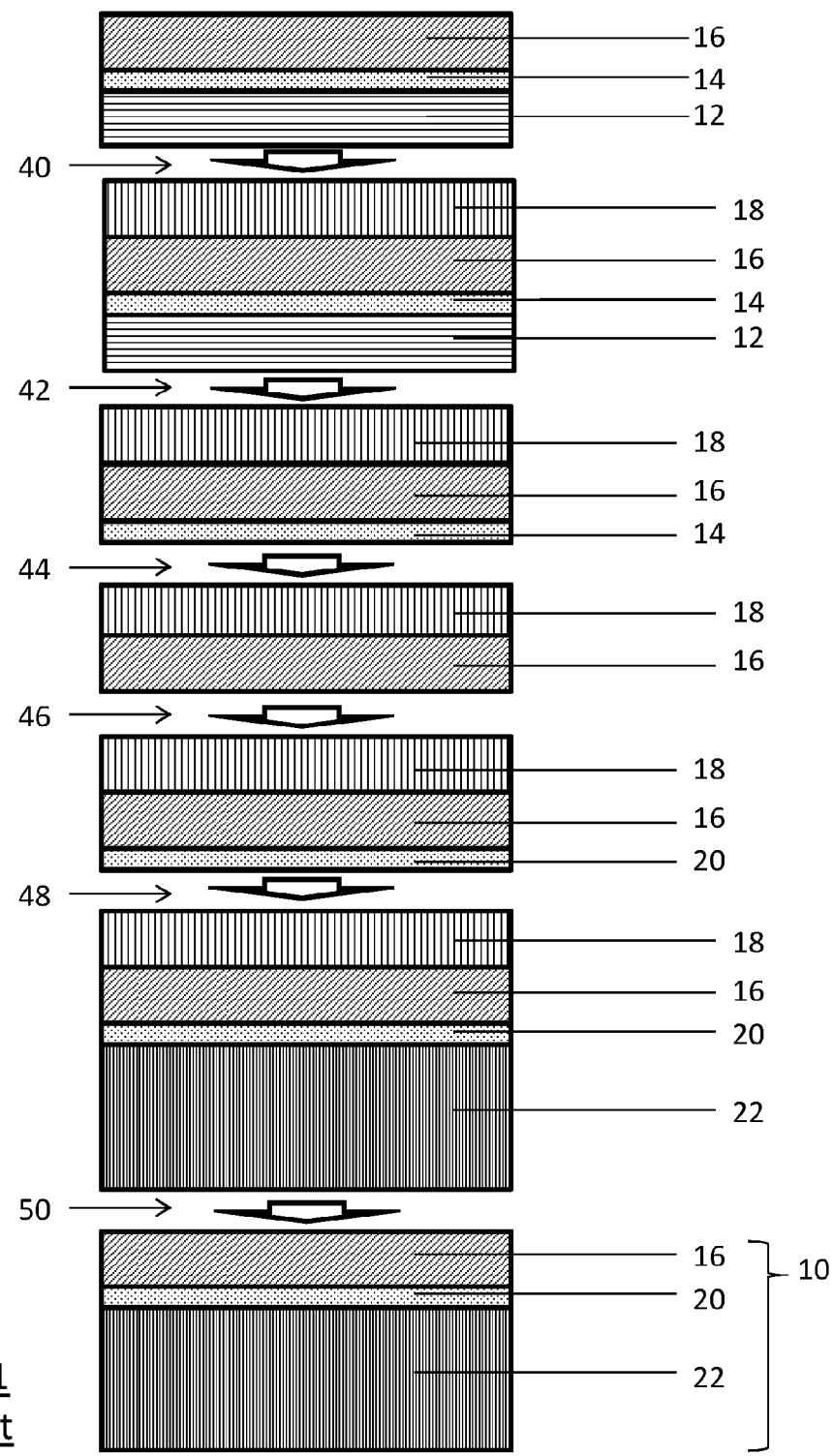
FIG. 1 (prior art) schematically shows a known technique for forming a semiconductor on diamond substrate.

In one embodiment, this invention provides a method 100 for forming a semiconductor on diamond substrate 110. An initial part of the method 100 comprises a method 100a of manufacturing a precursor 105a for subsequent use in manufacturing the semiconductor on diamond substrate 110. Advantageously, the inventive method 100a leads to an improved precursor 105a which subsequently leads to a better or more efficiently produced final semiconductor on diamond substrate 110 compared to prior art techniques. The precursor 105a is better because of how it is formed according to the inventive method 100a. In particular, as will become apparent, the surface boundaries between the layers of the precursor 105a and at the exposed surfaces of the precursor 105a are better than prior wafers for their subsequent intended use (formation of a suitable surface for nucleating diamond growth in combination with provision of a suitable device layer surface).

The method 100a of manufacturing a precursor 105a begins by starting with a base substrate 112. The base substrate may comprise any suitable materials that can be used for growth of the subsequent layers. The base substrate may comprise any one of a Si substrate, a SiC substrate, a GaN substrate, an AlN substrate, an AlN composite or a sapphire substrate. Alternatives include oxide based substrates such as $Ga_2O_3$, MgO. SiC substrates typically provide the highest quality GaN layer, while Si or AlN composite substrates result in much lower production costs, though at the expense of a slightly increased defect density in the GaN layer.

A next step of the method 100a comprises forming a sacrificial carrier layer 114 on the base substrate 112.

There are multiple known methods for forming or depositing layers. Layers can be deposited or grown. Two commonly used growth options are metal organic chemical vapour deposition (MOCVD) or molecular beam epitaxy (MBE). MOCVD is used more for growth on several large substrates in a single reactor. The skilled reader will be able to use and adapt standard techniques for layer formation. Different layer and layer compositions e.g. GaN, AlN, InN, ScN, BN and its alloys are made via changing the source materials or precursors in the growth system, and also oxide based layers can be considered. Other methods such as pulsed laser deposition, sputtering, magnetosputtering, atomic layer deposition (ALD) (part or even the whole epi may be grown using this method, in a thin layer) etc. could also be used.

The sacrificial carrier layer 114 comprises a single crystal semiconductor. The sacrificial carrier layer 114 in this embodiment may comprise any suitable material that a) attaches to the substrate 112 and b) can be selectively removed relative to an adjacent nucleation layer 116 later in the process (described below). The sacrificial carrier layer 114 may comprise any one of single crystal GaN, single crystal AlN, single crystal InN, single crystal AlGaN, single crystal InGaN, single crystal BN, single crystal BAlN, and also oxide based materials can also be considered. In this embodiment the single crystal sacrificial carrier layer has a thickness of over 100 nm. However, the thickness might also be less than 100 nm, dependent upon the etch selectivity. In case the sacrificial layer and the substrate are of the same material, the growth of the sacrificial layer can be omitted in some embodiments.

For the purposes of this specification, a single crystal layer means a layer that is substantially formed from one crystal. It may also be described as a mono crystalline layer, though it may contain defects, such as dislocations, slip planes, point defects etc. The density of said defects is low enough to provide improved heat transport and growth properties relative to conventional techniques. The layer may be formed of single or multiple mono crystalline portions (with or without defects). The advantage of this is that a better quality interface between layers is provided by virtue of preserving crystallinity. It is necessary to have single crystalline layers (or as close as possible via multiple mono crystalline portions) to seed further single crystalline material layers later in the process (not including growth of the diamond layer).

If the interlayer (nucleation layer) is lattice matched (strained) it will not generate additional dislocations in the subsequently grown layer. If, instead, a lattice mismatched layer was grown, then dislocations would be generated, which propagate into the device layers, which would be detrimental to the electrical and thermal properties—this is undesirable. Advantageously, therefore, the interlayer matches the crystal lattice of the layers below and above.

The single crystal sacrificial carrier layer 114 of this embodiment has a dislocation density of less than a first threshold dislocation density. In this example, the first threshold dislocation density is $10^9$ $cm^{-2}$. In some embodiments, the first threshold dislocation density is between $10^{10}$ $cm^{-2}$ and $10^{12}$ $cm^{-2}$, but it can also be lower.

The next step of the method 100a comprises forming a single crystal nucleation layer 116 on the sacrificial carrier layer 114. The single crystal nucleation layer 116 is configured to enable (at a later stage) diamond nucleation and growth. In particular, in this embodiment the single crystal nucleation layer comprises any material that is suitable for nucleating synthetic diamond growth. The single crystal nucleation layer may comprise any one of AlN, GaN, InN, AlGaN, ScN, BN, HfN, ZrN, Ge or alloys of those, and also oxide based layers. In other embodiments, the nucleation layer may comprise a metal such as Ir, W, Mo and Nb. Ir can be grown single crystal on top of materials such as MgO. As stated previously, the single crystal nature of this layer allows enhanced bonding (better surface connections and better transition properties) with the adjacent monocrystal sacrificial carrier layer. The single crystal nucleation layer may have a thickness of 5 nm to 100 nm, such as 5 nm to 50 nm. In some example embodiments, if the nucleation layer is an AlN layer, then there is a potential advantage to allowing it to relax since that would help to suppress the formation of parasitic lateral leakage channels. This would require some dislocations; however the threading dislocations would bend into the plane of the layer in order to release strain, and so the density of threading dislocations does not have to increase significantly. Indeed relaxed AlN interlayers are sometimes used as a growth tool to reduce threading dislocation density by bending the dislocations allowing them to combine and terminate and reduce strain. Therefore, in such examples, the thickness may be 5-8 nm for a strained layer, which is thick enough to act as an etch stop, or 8-50 nm for a relaxed layer. In terms of heat transport a thin dislocation free (strained) layer is preferred. This would be the lower 5-8 nm range for AlN examples. A thicker layer (relaxed) containing dislocations would have a higher thermal resistance. In other examples, if AlGaN is used as the nucleation layer, then the critical thickness before relaxation occurs is thicker, so in order to avoid a significant thermal resistance, the layer would probably be strained.

The single crystal nucleation layer 116 may comprise a plurality of nucleation sub-layers. The single crystal nucleation layer 116 may comprise two nucleation sub-layers. Additionally or alternatively, the single crystal nucleation layer 116 may comprise three, four or five nucleation sub-layers. At least one nucleation sub-layer may be a single crystal nucleation sub-layer and/or each nucleation sub-layer may be a single crystal nucleation sub-layer. Each nucleation sub-layer may comprise a material suitable for nucleating synthetic diamond growth. At least one nucleation sub-layer may be arranged to nucleate diamond growth and/or each nucleation sub-layer may be arranged to nucleate diamond growth. A nucleation sub-layer may comprise AlN, GaN, InN, AlGaN, ScN, BN, HfN, ZrN, Ge or alloys of those, and also oxide based layers. A nucleation sub-layer may comprise a metal such as Ir, W, Mo or Nb. A nucleation sub-layer may comprise AlN, AlGaN, or SiC. A first nucleation sub-layer may comprise a different material to a second nucleation sub-layer.

A first nucleation sub-layer may comprise a nitrogen-containing layer. The first nucleation sub-layer may comprise an aluminium-containing layer. The first nucleation sub-layer may comprise a nitride layer. The first nucleation sub-layer may comprise an AlN or AlGaN layer. The first nucleation sub-layer may be adjacent a device layer 118 (see below). A second nucleation sub-layer may comprise a carbon-containing layer. The second nucleation sub-layer may comprise a silicon-containing layer. The second nucleation sub-layer may comprise a carbide layer. The second nucleation sub-layer may comprise a SiC layer. The second nucleation sub-layer may be adjacent the sacrificial carrier layer 114. Accordingly, a diamond layer 122 may be grown on the second nucleation sub-layer. The second nucleation sub-layer may be thinner than the first nucleation sub-layer. The thickness of the first nucleation sub-layer may be 60 nm or less, 50 nm or less, 40 nm or less, 30 nm or less, or 20 nm or less. The thickness of the second nucleation sub-layer may be 50 nm or less, 40 nm or less, 30 nm or less, 20 nm or less, or 10 nm or less.

The method 100a may include consecutively and/or continuously forming the plurality of nucleation sub-layers. The second nucleation sub-layer may be formed on the sacrificial carrier layer 114 and the first nucleation sub-layer may be consecutively formed on the second nucleation sub-layer. The plurality of nucleation sub-layers may be continuously grown on the sacrificial carrier layer 114. Alternatively, in some embodiments, the first nucleation sub-layer may be formed on the sacrificial carrier layer 114 and the second nucleation sub-layer may be formed after removal of the sacrificial carrier layer 114 (see below).

The thermal conductivity of the nucleation layer is between 5 and 400 W/(m·K). In some example embodiments the thermal conductivity may be 300 W/(m·K) for an AlN nucleation layer, or 400 W/(m·K) for a BN nucleation layer (this is the value for the basal plane direction. It is closer to 10 W/m·K in the through-plane direction (heat flow direction)), or 10 W/(m·K) for a ScN nucleation layer, or 50 W/(m·K) for a ZrN nucleation layer. The higher the thermal conductivity of the material, the better for heat transport in the device. Also, it is important to consider the lattice mismatch of the nucleation layer to the sacrificial carrier layer—preferably this should be kept to less than 15%; however typically it is only a few percent, to minimize any extra dislocations introduced in the growth of the nucleation layer.

In other examples, thermal conductivities based on these bulk thermal conductivity values at 300K are as follows:
AlN: ~20 W/m·K at 5 nm-thick and ~180 W/m·K at 100 nm-thick; and
BN: ~12 W/m·K at 5 nm-thick and ~27 W/m·K at 100 nm-thick.

Other examples will be apparent to the skilled reader. Preferably, the single crystal nucleation layer has a dislocation density less than a second threshold dislocation density. In this example the second threshold dislocation density is $0.5 \times 10^9$ cm$^{-2}$. This level may be advantageous for GaN HEMT examples. In some embodiments, the second threshold dislocation density is between $0.5 \times 10^{10}$ cm$^{-2}$ and $0.5 \times 10^{11}$ cm$^{-2}$ but it can also be lower. For example, when manufacturing for laser diode or microelectronic applications, the second threshold dislocation density may be lower, e.g. $10^4$ cm$^{-2}$ or $10^8$ cm$^{-2}$.

In general, preferably, the dislocation density decreases through the device structure, but in some cases it may actually increase in between for one of the layer boundaries. So, in some other examples, the second threshold dislocation density may be higher than the first threshold density, because due to large strain mismatch, extra dislocations could be formed. E.g. if AlN is grown on a GaN sacrificial layer, as the AlN gets thicker, defects can emerge, thus defect density increases. However, as discussed above, in cases with dislocation bending, the defect density can also decrease dependent on the specific scenario. In general it is desirable to keep defect density lower.

In some examples covered by the present invention, defect density within the sacrificial layer may be $10^8$ cm$^{-2}$, and within the AlN layer could be $10^9$ cm$^{-2}$—the end product would still benefit from the inventive method even though the dislocation density within the nucleation layer is greater than the dislocation density in the sacrificial carrier layer.

The inventors have considered the critical thickness of the nucleation interlayer. AlN can be grown up to about 10 nm-thick on GaN before strain relaxation occurs. Making it thicker than this may not provide large gains since the relationship between the layer thermal conductivity and thermal conductivity is non-linear, i.e. the thermal resistance of the layer would increase even if the thermal conductivity is higher for the thicker layer.

The next step of the method of the method 100a comprises forming a single crystal device layer 118 on the single crystal nucleation layer 116. The device layer 118 comprises a single crystal semiconductor. The device layer 118 can be any single crystal semiconductor that achieves the desired effect of providing a suitable surface for electrical circuit formation therein or thereon. The device layer 118 may comprise any one of GaN, AlN, InN, BN and alloys thereof, and oxide based materials such as $Ga_2O_3$, MgO. In some embodiments the single crystal device layer has a thickness of 100 nm to 5000 nm. In other embodiments, the device layer may be a multi-layer structure. For example the device layer may be a GaN/AlGaN layer (e.g. this type of layer is suitable for forming transistors). The device layer in other embodiments may be a GaN/InGaN/GaN layer (e.g. this type of layer is useful for light emitting devices). In such examples, each different layer of the multilayer structure is a single crystal layer. A multilayer device layer may comprise e.g. a 25 nm AlGaN on GaN layer, or 3 nm GaN-20 nm AlGaN—GaN layer or a GaN—InGaN—GaN layer combination etc. and in some embodiments could also include SiC based device structures or $Ga_2O_3$ and related device structures. The single crystal device layer has a dislocation density in this embodiment of less than a third threshold dislocation density. The third threshold dislocation density in this example is $10^8$ cm$^{-2}$. In other embodiments the third threshold dislocation density may be lower or higher. In general, if the third threshold dislocation density is greater than $10^{10}$ cm$^{-2}$ then the device will not function properly. This invention helps to more efficiently manufacture a high quality finished device by virtue of the improved precursor manufacturing method, with the added potential of the included nucleation layer controlling the dislocation density in the device structure.

Figure 2:
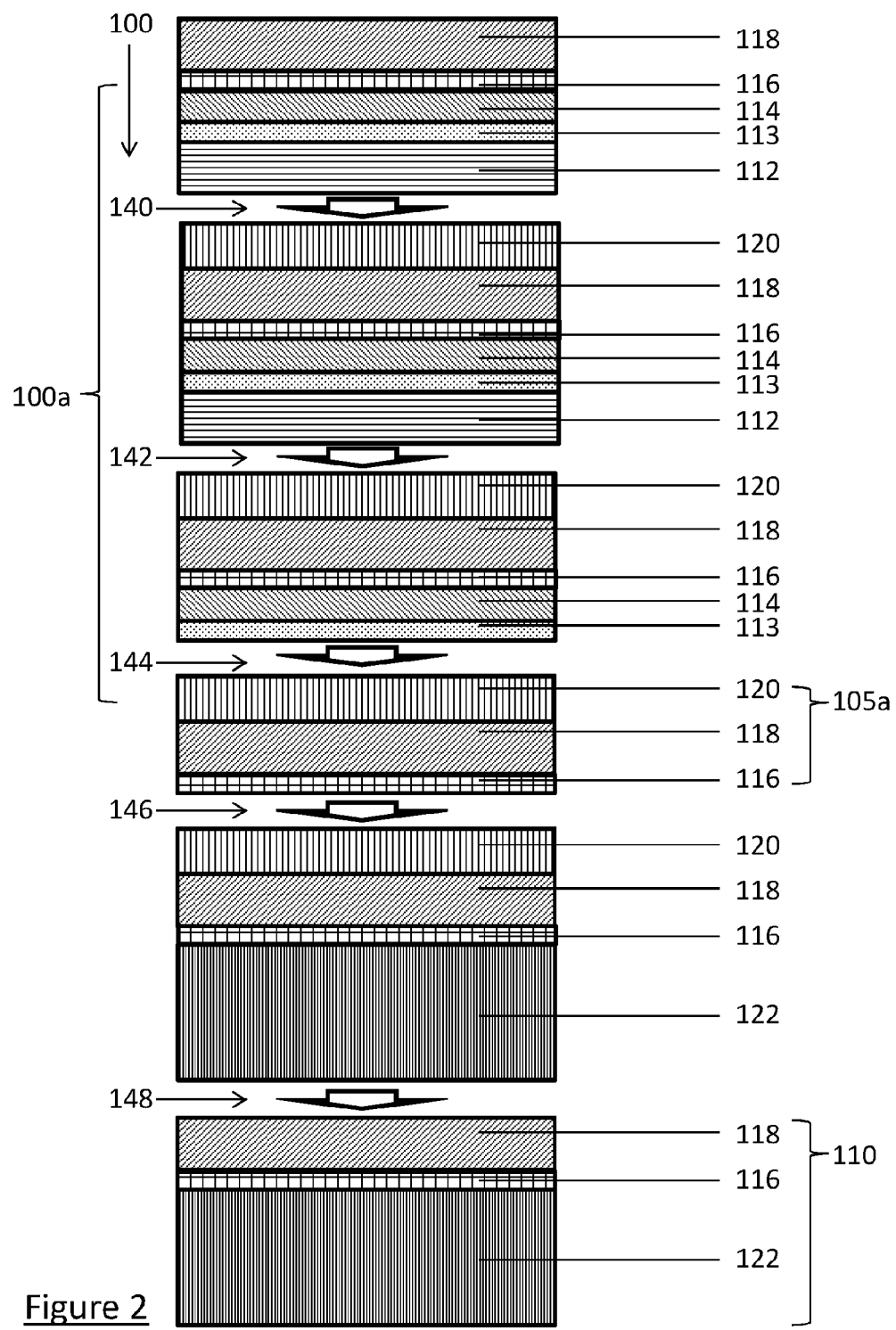
FIG. 2 schematically shows a method for forming a semiconductor on diamond substrate including a method for forming a precursor according to an embodiment of the invention.

In FIG. 2, the starting structure includes a further layer between the base substrate 112 and the sacrificial carrier layer 114. In most, but not all, embodiments, there is provided a transition layer (or multiple transition layers) 113 before the sacrificial carrier layer is formed. The transition layer 113 is formed between the base substrate 112 and the sacrificial carrier layer 114. The one or more transition layers 113 are arranged to facilitate smooth growth transition from the base substrate 112 to the sacrificial carrier layer 114. The transition layer(s) provide strain relief and ensure that the layer grows well. Facilitating transition comprises relieving strain and/or nucleating growth of the sacrificial carrier layer 114 or both. The transition layer may comprise any one or more of AlN, GaN, AlGaN or AlGaN/AlGaN, BN or alloys thereof. In some embodiments the transition layer comprises a 5 nm to 200 nm thickness AlN or AlGaN layer having 3D morphology and having been grown on a SiC or sapphire substrate (for subsequent GaN sacrificial carrier layer growth). In other examples, the transition layer comprises on a silicon substrate, an AlN transition layer followed by a GaN/AlN superlattice, transition layer for subsequent GaN or other material sacrificial carrier layer growth (112). In yet another example, on a Si substrate, the transition layer comprises an AlN transition layer followed by an AlN/AlGaN/GaN graded alloy transition layer (used for subsequent GaN sacrificial carrier layer growth). In one example the transition layer is a very thin, e.g. 10 nm, very high defect density single crystal semiconductor layer. In some GaN on Si embodiments, the transition layer can be as thick as 4 microns. For GaN on SiC embodiments, the transition layer may be between 10 nm and 30 nm. This layer nucleates growth of a GaN sacrificial carrier layer.

The or each transition layer assists with any one or a combination of lattice matching, strain matching and nucleation between bordering layers.

In some embodiments, there is no transition layer between the substrate and the sacrificial carrier layer.

In this embodiment, the sacrificial carrier layer 114, the nucleation layer 116 and the device layer 118 are continuously grown on the substrate, or on the substrate and transition layer(s). In this example, continuously growing comprises performing the relevant forming steps in a growth chamber and not removing the precursor that is being manufactured from the growth chamber during performance of the steps.

In some embodiments, during manufacture the precursor may be moved from one growth chamber to another under controlled conditions to ensure consistent growth. For example, within two connected growth chambers, connected via a vacuum channel, growth of the precursor may be stopped in one chamber and the precursor moved to the other chamber to continue the growth.

In other embodiments the precursor 105a may not be continuously grown.

By continuously growing these layers, advantageously, a precursor having good surface matched properties between its layers is provided. Not removing the precursor from the growth chamber during the continuous growing provides further benefits, e.g. preventing surface reconstruction or contamination. In conjunction with using a single crystal carrier layer, nucleation layer and device layer, a precursor having good strain and lattice matched properties is provided.

In this example, the nucleation layer 116 is deposited via 2D layer by layer growth. In other embodiments 3D growth may be used. 2D growth of the nucleation layer is preferred in order to avoid introducing defects within this layer. The 3D growth option may be considered more practical for growth of the transition layer(s) 113.

In this example, continuously growing comprises reasonably lattice matching (in some embodiments, there is a less than 15% difference in lattice constant of the two materials; preferably less than 1-3%, although larger is possible) the sacrificial carrier layer with the single crystal nucleation layer and the single crystal nucleation layer with the device layer. For example, for AlN the lattice constant difference may be 2.4%, which allows a ~10 nm thick interlayer.

In this embodiment, the method 100a further comprises a step 140 of bonding or forming a handle layer 120 on the device layer 118. The handle layer comprises any layer that is suitable for subsequently gripping the device layer or device at a later stage of the manufacturing process. In some embodiments a spin-on-glass attaches the handle layer to the device layer. The handle layer is also a type of sacrificial layer. Within this specification, a sacrificial layer is one which is to be removed at a later stage of the manufacturing process and will not be present in the final semiconductor on diamond substrate 110. Example handle wafers may include Si, GaAs, Ge (although mostly Si would be used as it is relatively cheap and it can be removed easily).

The method 100a further comprises removing 142 the base substrate 112. In this example the base substrate is removed via a chemical or mechanical polishing process or by a combination thereof. This can be a selective or a non-selective removal process.

In embodiments where one or more transition layers 113 are present, then the method 100a comprises removing 144 the or each transition layer 113. In this example, removing 144 the transition layer 113 is achieved by selectively removing, such as by selectively etching, the transition layer 113. Selective etching techniques include reactive ion etching, for example with bespoke gases for GaN/AlN interface and liquid based etching. Selective removal, such as selective etching, is, for the purposes of this specification, removal of one material from an adjacent material where the materials have significantly different removal rates to each other for a particular removal process. For example, GaN has a significantly different removal rate to AlN for a particular gas or liquid i.e. reactive ion etching or wet etching process respectively. A liquid based etch example may include KOH under UV illumination (photon energy>bandgap GaN (but smaller than bandgap AlN, SiC, BN etc. Selective removal techniques will be apparent to the skilled reader familiar with clean-room processes.

In contrast, non-selective removal may be achieved by mechanical etching or polishing or non-selective chemical processes, for example.

The method 100a at step 144 comprises removing the sacrificial carrier layer 114 along with any transition layer 113 that may be present in some embodiments. Following step 144, the precursor 105a is formed in this example (see FIG. 2). In other examples (see FIGS. 3 and 4), the precursor may be considered formed at an earlier stage as discussed in further detail below.

In this example the sacrificial carrier layer 114 is formed from a first material such that the sacrificial carrier layer has a first removal rate. The nucleation layer 116 is formed from a second material such that the nucleation layer has a second removal rate. The first removal rate is different from the second removal rate such that using a selective removal technique, such as a selective etching removal technique, it is possible to efficiently remove the sacrificial carrier layer cleanly and efficiently leaving a good, clean and atomically smooth nucleation layer surface for subsequent diamond growth. Advantageously, the present inventive method 100a offers this advantage, which is not present with any other known method. This advantage results from the nature of the initial single crystal layer growth at the first stage shown schematically in FIG. 2. The nucleation layer is sandwiched between the device layer and the sacrificial carrier layer having removal properties such that the subsequent selective etching (step 144) is made efficiently possible. This arrangement results in allowing an efficient technique (selective removal) to be used for providing a good quality nucleation surface. It also allows the fabrication of an on diamond semiconductor, e.g. GaN device layer of well-defined thickness, without the need to use a timed etch. In the present state of the art, the GaN layer thickness in the final product can mostly only be controlled by a timed etch. The introduction of the selective etch at a key stage is a technical advantage. Avoiding the use of a timed etch provides easier manufacture.

In some embodiments, the second nucleation sub-layer may be formed after removal of the sacrificial carrier layer 114. Removal of the sacrificial carrier layer 114 may expose the first nucleation sub-layer. Accordingly, the second nucleation sub-layer may be formed on the first nucleation sub-layer after removal of the sacrificial carrier layer 114. A diamond layer 122 may then be formed on the second nucleation sub-layer. The second nucleation sub-layer may, therefore, be adjacent the diamond layer 122.

The use of a plurality of nucleation sub-layers may provide technical benefits compared to using a single nucleation layer 116. In some cases, the effective thermal boundary resistance between the nucleation layer 116 and the diamond layer 122 may be sub-optimal due to alloying of the nucleation layer 116 with the surrounding layers (such as sacrificial carrier layer 114 or device layer 118). Alloying may lead to worse adhesion between the nucleation layer 116 and diamond layer 122. The use of a second nucleation layer may lead to improved effective thermal boundary resistance between the nucleation layer 116 and diamond layer 122, which may be due to improved adhesion between the layers. For example, if the second nucleation sub-layer is formed on the first nucleation sub-layer after removal of the sacrificial carrier layer, there can be no alloying of the second nucleation sub-layer with the sacrificial carrier layer. Similarly, in cases where the nucleation sub-layers are grown continuously, alloying between the sacrificial carrier layer 114 and the first nucleation sub-layer may be reduced or eliminated due to the presence of the second nucleation sub-layer.

In one example, sacrificial carrier layer 114 and device layer 118 may comprise GaN. Nucleation layer 116 may comprise AlN or AlGaN. In some cases, it may be difficult to form an AlN or AlGaN nucleation layer 116 with a high Al content due to alloying of the nucleation layer 116 with the surrounding GaN layers. A nucleation layer 116 having a low Al content may lead to worse effective thermal boundary resistance compared to a nucleation layer 116 having a high Al content. To overcome this problem, a second nucleation sub-layer, such as a SiC layer, may be formed. Use of the second nucleation sub-layer may lead to improved effective thermal boundary resistance and consequently improved device thermal performance. In some cases, it may be possible to grow an AlN or AlGaN nucleation layer 116 of sufficiently high Al content so that a second nucleation sub-layer is not required.

A method may include forming a first Al-containing nucleation sub-layer; determining the Al content of the first nucleation sub-layer; and forming a second nucleation sub-layer if the Al content of the first nucleation sub-layer is determined to be below a predetermined threshold. The steps of the method may be performed consecutively, or other steps—such as other steps of the method 100a described herein—may be performed in between the aforementioned steps. The predetermined threshold may be 80% Al, 70% Al, 60% Al, 50% Al or 40% Al. The Al content may be determined relative to a second cation and/or metal; for example, a pure AlN layer may be considered to contain 100% Al, whereas an AlGaN layer containing equal amounts of Al and Ga may be considered to contain 50% Al. The Al content may be determined relative to the corresponding anion present in the first nucleation sub-layer; for example, a layer including equal amounts of Al and the corresponding anion (such as N) may be considered to contain 100% Al, whereas a layer containing half as much Al relative to the corresponding anion (such as N) may be considered to contain 50% Al.

The method 100 of manufacturing a semiconductor on diamond substrate 110 further comprises growing 146 a diamond layer 122 onto the nucleation layer 116 after the selective removal of the sacrificial carrier layer 114. In this example, the diamond layer comprises a synthetic diamond layer. The diamond layer can be efficiently grown without the need for further preparing the nucleation surface following step 144 in this example. In other examples, there may be minimal or only a little preparation work required between steps 144 and 146, especially when compared to prior techniques for growing diamond on nucleation surfaces that have been prepared in a different manner.

In one example, the preparation work might include treating an AlN nucleation surface with a plasma. The plasma treatment may comprise treating the AlN nucleation surface with $N_2$ and/or $H_2$ plasma. In one specific case, the treatment may comprise treating the AlN nucleating layer with 10% $N_2/H_2$ plasma for 10 minutes. This pre-treatment has been shown by the inventors to increase the oxygen content of the AlN nucleating surface. Such a pre-treated surface allows growth of a thick (>10 μm in some examples; or >50 μm in some examples, or >100 μm in some examples) diamond layer thereon.

The method 100 further comprises the step 148 of removing the handle layer 120. As will be appreciated, until this stage the handle layer 120 was necessary to handle the precursor during the manufacturing process in order to avoid damage of the device layer 118, which is a part of the final semiconductor on diamond substrate 110. In this particular example, the handle layer is removed by a selective removal process. In this example, the device layer 118 is formed from a third material such that the device layer has a third removal rate. The handle layer comprises a fourth material such that the handle layer has a fourth removal rate. The fourth removal rate is different from the third removal rate and therefore selective removal of the handle layer from the device layer at step 148 is made efficient and possible. The device layer 118 in the semiconductor on diamond substrate 110 has an exposed surface as shown in FIG. 2. Due to the selective removal process used at step 148, reduced processing of the exposed surfaced (or in some examples no further processing of the exposed surface) is required to place it in condition for subsequent use in its role as a device layer.

In some embodiments, top surface of the device layer is protected, e.g. with SiN, prior to attachment of the handle wafer. Once the handle wafer (or the spin-on glass used to attach handle wafer) is removed, this SiN layer (which can be broadly called a protective layer) is removed prior to the device processing on the wafer. This protective layer protects the top surface of the device grade material. In some embodiments the SiN layer will be retained during device manufacture.

In other embodiments, the precursor 105 may be considered formed at an earlier stage.

Figure 3:
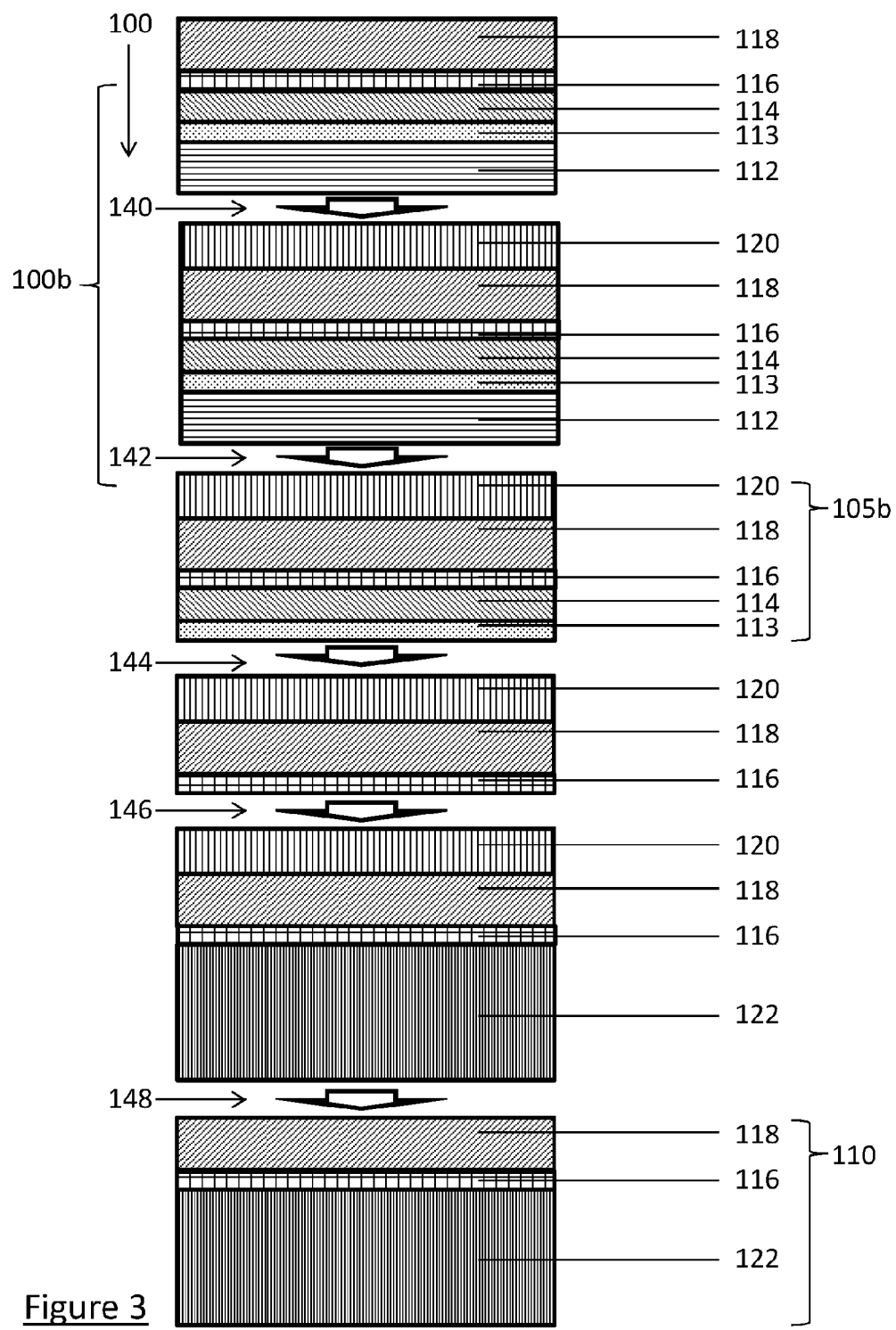
FIG. 3 schematically shows a method for forming a semiconductor on diamond substrate including a method for forming a precursor according to another embodiment of the invention.

In the example of FIG. 3, the precursor may be considered formed before removal of the sacrificial carrier layer 114, i.e. before step 144 and after step 142.

Figure 4:
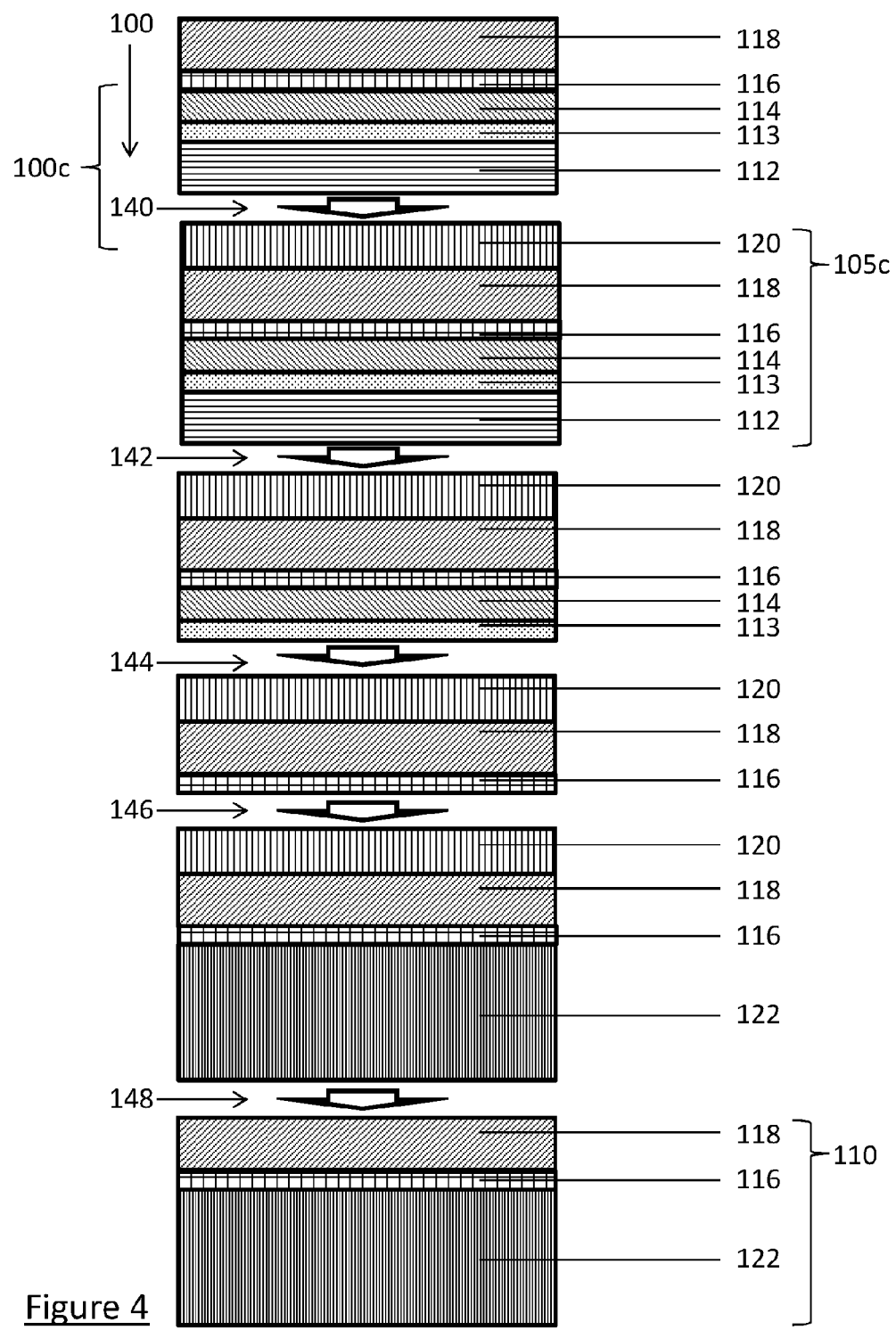
FIG. 4 schematically shows a method for forming a semiconductor on diamond substrate including a method for forming a precursor according to another embodiment of the invention.

In the example of FIG. 4, the precursor may be considered formed before step 142 and after step 140, i.e. before the removal of the base substrate 112.

In yet further embodiments the precursor may be considered formed before adding the handle layer 120, i.e. before step 140.

In these various examples and embodiments, the initial stage of providing a sandwiched nucleation layer with a device layer 118 on one side and a sacrificial carrier layer 114 on its other side already provides a useful, technically advantageous starting point for efficiently implementing subsequent steps of the method that is not known in prior precursors for making a semiconductor on diamond substrate.

Some specific example embodiments of the configuration of the precursor will now be described in more detail.

Example 1

Substrate=Si
Sacrificial carrier layer=single crystal GaN with AlGaN based strain relieve layer. Properties include thickness=1 μm; dislocation density=$10^9$ $cm^{-2}$.
Nucleation layer=single crystal AlN. Properties include dislocation density=$10^9$ $cm^{-2}$.
Device layer=single crystal GaN with 25 nm AlGaN on top. Properties include dislocation density=$10^9$ $cm^{-2}$; etc.

Example 2

Substrate=SiC
Sacrificial carrier layer=single crystal GaN with AlN nucleation layer. Properties include thickness=1 μm; dislocation density=$10^8$ $cm^{-2}$.
Nucleation layer=single crystal AlN. Properties include dislocation density=$10^8$ $cm^{-2}$.
Device layer=single crystal GaN with 25 nm AlGaN on top. Properties include dislocation density=$10^8$ $cm^{-2}$; etc.

Example 3

Substrate AND sacrificial carrier layer=GaN (the GaN layer is formed unitarily and serves as both the substrate and the sacrificial carrier layer).
Nucleation layer=single crystal AlN. Properties include dislocation density=$10^6$ $cm^{-2}$.
Device layer=single crystal GaN with InGaN quantum wells incorporated. Properties include dislocation density=$10^6$ $cm^{-2}$; etc.

Example 4

Substrate AND sacrificial carrier layer=$Ga_2O_3$ (the $Ga_2O_3$ layer is formed unitarily and serves as both the substrate and the sacrificial carrier layer).
Nucleation layer=single crystal GaAlO. Properties include dislocation density=$10^6$ $cm^{-2}$.
Device layer=single crystal $Ga_2O_3$. Properties include dislocation density=$10^6$ $cm^{-2}$; etc.

Embodiments of this invention allow selective removal back to the nucleation layer. This leads to provision of a good nucleation surface for diamond growth, which in turn provides better heat transfer in the final product. An advantage is that the selective etching stops at the nucleation layer, and therefore the fabrication of a single crystalline nucleation layer can be carried out with ease. The nucleation layer, being single crystal, has a higher thermal conductivity than commonly used amorphous nucleation layers such as $SiO_2$ and $Si_3N_4$ of the prior art in some examples (>10 W/mK), which aids heat transfer through it. Considering that the surface of such a fabricated nucleation layer is smooth, there will be furthermore little phonon scattering due to interface roughness, which furthermore can hinder heat transfer.

In some examples, the inventors have considered the thermal resistance of the interface between the GaN device layer and diamond substrate.

Consider Case (1)—Prior Art:

For an amorphous nucleation layer (50 nm-thick silicon nitride) the effective thermal resistance of this interface will be $5 \times 10^{-8}$ $m^2 K/W$ (this value will scale with the layer thickness). This will account for about 40% of the total thermal resistance at the chip level for example for an 8 finger, 125 μm wide GaN transistor with a 35 μm gate finger spacing device geometry.

Consider Case (2):

For the same 8 finger, 125 μm wide GaN transistor with a 35 μm gate finger spacing device geometry, for a 10 nm thick crystalline AlN nucleation layer, we estimate a thermal conductivity of about 20 W/mK (due to the reduced phonon mean free path). This would result in an effective interface thermal resistance of $0.5 \times 10^{-9}$ $m^2 \cdot K/W$. The intrinsic thermal resistance between GaN and diamond (phonon mismatch) is around $2 \times 10^{-9}$ m²·K/W.

Therefore, the thin crystalline AlN nucleation layer (that is efficiently formed according to the present method) does not add measurably to the device thermal resistance. In fact, as long as the thermal conductivity of the 10 nm thick layer is >5 W/m·K, this is the case.

Comparing case (1), the current state of the art, versus case (2), an example of the proposed inventive method, the inventors have reduced the temperature rise on the chip by 40% (excluding packaging thermal resistance etc.).

This invention can be used to make components such as electronic, optical, opto-electronic components.

As mentioned previously, this invention allows efficient manufacture of a structure having excellent thermal conductivity properties. The invention provides a semiconductor-on-diamond substrate comprising a single-crystal device layer or semiconductor device multilayer structure, a single-crystal nucleation layer arranged to nucleate diamond growth and a diamond layer wherein the thermal resistance of the interface between the device layer or semiconductor device multilayer structure and the diamond layer is improved relative to prior systems.

The inventors have investigated expected thermal conductivity and thermal boundary resistance properties for different proposed materials as summarised in the following table.

The phonon mean free path is calculated using:

$$\kappa \simeq \frac{1}{3}(v_s l)c_v,$$

where K=thermal conductivity, $v_s$=acoustic velocity, $c_v$=volumetric heat capacity.

The thin film thermal conductivity is calculated using the Landauer model which applies to ballistic heat conduction in thin films. The effective phonon mean free path is calculated using the bulk phonon mean free path ($l_{ph}$) and the boundary length (L).

$$\langle\langle l_{ph}\rangle\rangle_{eff} = \frac{\langle\langle l_{ph}\rangle\rangle}{1 + (4/3)(\langle\langle l_{ph}\rangle\rangle/L)}, \quad (7a)$$

The following table shows the thermal conductivities and effective thermal boundary resistance values, assuming defect free material. Most of these values come from http://www.ioffe.ru/SVA/NSM/Semicond/. Room temperature values are used.

In general, the inventors' investigations show that even a low thermal conductivity material such as $Ga_2O_3$ will not be a major thermal barrier at 50 nm-thick, providing that the layer is dislocation/defect free. This factor will determine the maximum thickness that can be grown.

When used in this specification and claims, the terms "comprises" and "comprising" and variations thereof mean that the specified features, steps or integers are included. The terms are not to be interpreted to exclude the presence of other features, steps or components.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

What is claimed:

1. A method of manufacturing a semiconductor-on-diamond substrate, the method comprising:
    a) starting with a base substrate;
    b) forming a sacrificial carrier layer on the base substrate, the sacrificial carrier layer comprising a single-crystal semiconductor;
    c) forming a single-crystal nucleation layer on the sacrificial carrier layer, the single-crystal nucleation layer arranged to nucleate diamond growth;
    d) forming a device layer on the single-crystal nucleation layer, the device layer comprising a single-crystal semiconductor layer or multiple single-crystal semiconductor layers;
    e) removing the base substrate;
    f) selectively removing the sacrificial carrier layer wherein the selective removal process stops at the nucleation layer; and
    g) growing a diamond layer onto the nucleation layer after the selective removal of the sacrificial carrier layer;
    wherein step b) comprises forming the sacrificial carrier layer from a first material such that the sacrificial carrier layer has a first removal rate, and wherein step c) comprises forming the nucleation layer from a second material such that the nucleation layer has a second removal rate, wherein the first removal rate is different from the second removal rate.

2. The method of claim 1 comprising continuously growing the sacrificial carrier layer then the nucleation layer then the device layer to achieve steps b) to d) wherein the continuously growing comprises performing steps b) to d) in a growth chamber and not removing the precursor being manufactured from the growth chamber during performing steps b) to d).

TABLE 1

| Material | Density [Kg/m3] | Spec. heat J/Kg | Acoustic vel. [m/s] | Bulk therm. cond. [W/m · K] | Phonon mean free path [nm] | Thickness [nm] | k [W/mK] | TBR [W/mK] | Thickness [nm] | k [W/mK] | TBR [W/mK] |
|---|---|---|---|---|---|---|---|---|---|---|---|
| AlN | 3260 | 780 | 7800 | 300 | 45 | 10 | 43 | 2.4E−10 | 50 | 136 | 3.7E−10 |
| BN | 2100 | 600 | 3300 | 30 | 22 | 10 | 8 | 1.3E−09 | 50 | 19 | 2.6E−09 |
| SiC | 3200 | 750 | 9000 | 400 | 56 | 10 | 48 | 2.1E−10 | 50 | 161 | 3.1E−10 |
| GaN | 6150 | 490 | 6000 | 200 | 33 | 10 | 37 | 2.7E−10 | 50 | 106 | 4.7E−10 |
| AlGaN | 4500 | 600 | 6000 | 30 | 6 | 10 | 17 | 5.8E−10 | 50 | 26 | 1.9E−09 |
| ScN | 6150 | 490 | 6000 | 20 | 3 | 10 | 14 | 7.2E−10 | 50 | 18 | 2.7E−09 |
| Si | 2300 | 700 | 6700 | 20 | 6 | 10 | 11 | 8.7E−10 | 50 | 17 | 2.9E−09 |
| TiN | 5400 | 490 | 6000 | 20 | 4 | 10 | 13 | 7.5E−10 | 50 | 18 | 2.8E−09 |
| Ga2O3 | 6000 | 500 | 4000 | 20 | 5 | 10 | 12 | 8.3E−10 | 50 | 18 | 2.8E−09 |

3. The method of claim 1 wherein the step of forming the single-crystal nucleation layer comprises depositing the nucleation layer via 2D or 3D growth or layer by layer growth.

4. The method of claim 2 wherein the continuously growing comprises lattice matching, such that there is a less than 15% difference in lattice constant, the sacrificial carrier layer with the single-crystal nucleation layer and the single-crystal nucleation layer with the device layer.

5. The method of claim 1 comprising, after step a) and before step b), forming one or more transition layers between the base substrate and the sacrificial carrier layer, the one or more transition layers being arranged to facilitate transition from the base substrate to the sacrificial carrier layer, wherein facilitating transition comprises relieving strain or nucleating growth of the sacrificial carrier layer or both.

6. The method of claim 1 comprising bonding or forming a handle layer on the device layer.

7. The method of claim 5 comprising selectively removing the one or more transition layers.

8. The method of claim 6 comprising removing the handle layer.

9. The method of claim 6 wherein step d) comprises forming the device layer from a third material such that the device layer has a third removal rate, bonding or forming the handle layer comprises bonding or forming the handle layer comprising a fourth material such that the handle layer has a fourth removal rate, wherein the fourth removal rate is different from the third removal rate.

* * * * *